United States Patent
Kim

(10) Patent No.: US 10,306,170 B2
(45) Date of Patent: *May 28, 2019

(54) COMPARISON DEVICE AND IMAGE SENSOR INCLUDING THE SAME

(71) Applicant: SK hynix Inc., Gyeonggi-do (KR)

(72) Inventor: Tae-Gyu Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 16 days.

This patent is subject to a terminal disclaimer.

(21) Appl. No.: 15/601,071

(22) Filed: May 22, 2017

(65) Prior Publication Data

US 2018/0084213 A1    Mar. 22, 2018

(30) Foreign Application Priority Data

Sep. 19, 2016 (KR) .................. 10-2016-0119165

(51) Int. Cl.
| | |
|---|---|
| H03K 17/00 | (2006.01) |
| H04N 5/378 | (2011.01) |
| H04N 5/225 | (2006.01) |
| H04N 5/357 | (2011.01) |
| H04N 5/3745 | (2011.01) |
| H03K 5/1252 | (2006.01) |

(52) U.S. Cl.
CPC .......... *H04N 5/378* (2013.01); *H04N 5/2258* (2013.01); *H04N 5/3575* (2013.01); *H04N 5/3745* (2013.01); *H03K 5/1252* (2013.01)

(58) Field of Classification Search
None
See application file for complete search history.

(56) References Cited

U.S. PATENT DOCUMENTS

| | | | |
|---|---|---|---|
| 2015/0014517 A1 | 1/2015 | Ikebe | |
| 2016/0100115 A1* | 4/2016 | Kusano | H03M 1/56 250/208.1 |
| 2017/0318247 A1* | 11/2017 | Kim | H04N 5/378 |
| 2017/0339359 A1* | 11/2017 | Kim | H04N 5/378 |

* cited by examiner

*Primary Examiner* — Long Nguyen
(74) *Attorney, Agent, or Firm* — IP & T Group LLP

(57) ABSTRACT

A comparison device includes a comparison block suitable for comparing an upper ramp signal or a lower ramp signal with a pixel signal, and outputting a comparison signal; a CDS block provided between a first input terminal into which the pixel signal is inputted and a negative input terminal of the comparison block, and configured to perform correlated double sampling; a second switch provided between a second input terminal into which the lower ramp signal is inputted and a positive input terminal of the comparison block; a third switch provided between a third input terminal into which the upper ramp signal is inputted and the positive input terminal of the comparison block; and a feedback control unit suitable for checking a magnitude of the pixel signal according the comparison signal and outputting a second control signal or a third control signal for controlling the second or third switch.

8 Claims, 6 Drawing Sheets

COMPARISON DEVICE AND IMAGE SENSOR INCLUDING THE SAME

CROSS-REFERENCE TO RELATED APPLICATION

The present application claims priority of Korean Patent Application No. 10-2016-0119165, filed on Sep. 19, 2016, which is incorporated herein by reference in its entirety.

TECHNICAL FIELD

Various embodiments of the present invention relate to an image sensor, and, more particularly, to a comparison device and an image sensor including the same capable of reducing a time it takes to convert data according to image data so that data processing speed is increased and power consumption is minimized, and capable of reducing the number of counts required for data conversion so that power consumption required for counting and noise attributable to counting are reduced.

DESCRIPTION OF THE RELATED ART

Generally, complementary metal oxide semiconductor (CMOS) image sensors (CISs) which are embodied through CMOS processes are expanding rapidly into markets because of advantages of low power consumption, low cost and a small size compared to other competitive products. Particularly, as the image quality of CMOS age sensors which has been relatively insufficient compared to that of competitive products is improved, the sphere of application thereof is increasingly widening to a video region, which demands high resolution and a high-speed frame rate.

In order to realize a CMOS image sensor having a high-speed frame rate and high resolution, it is important to improve the analog-to-digital conversion (ADC) characteristics of the image sensor.

However, using a conventional analog-to-digital conversion method, it is difficult to reduce the maximum time it takes to convert data. Hence, there is a disadvantage in that the power consumption is increased.

SUMMARY

Various embodiments are directed to a comparison device and an image sensor including the same capable of reducing a counting number and a data conversion time to thereby increase data processing speed while minimizing power consumption and noise.

Various embodiments are directed to a comparison device and a CMOS image sensor including the same, which checks the magnitude of a pixel signal by comparing a pixel signal with a reference voltage, generates a control signal for selecting an upper ramp signal or a lower ramp signal depending on a result of the comparison, selects the upper ramp signal or the lower ramp signal according to the control signal, and then performs a comparison operation.

In an embodiment, comparison device may include a comparison block suitable for comparing an upper ramp signal or a lower ramp signal with a pixel signal, and outputting a comparison signal; a correlated double sampling (CDS) block provided between a first input terminal into which the pixel signal is inputted and a negative input terminal of the comparison block, and configured to perform correlated double sampling; a second switch provided between a second input terminal into which the lower ramp signal is inputted and a positive input terminal of the comparison block; a third switch provided between a third input terminal into which the upper ramp signal is inputted and the positive input terminal of the comparison block; and a feedback control unit suitable for checking a magnitude of the pixel signal according the comparison signal and outputting a second control signal or a third control signal for controlling the second or third switch.

In an embodiment, complementary metal oxide semiconductor (CMOS) image sensor may include a pixel array suitable for outputting pixel signals corresponding to incident light; a row decoder suitable for selecting and controlling pixels in the pixel array by row lines; a ramp signal generation device suitable for generating an upper ramp signal and a lower ramp signal; a comparison unit suitable for selecting a value of the upper ramp signal or the lower ramp signal and comparing the selected value with a value of each of the pixel signals outputted from the pixel array; a counting unit suitable for counting a clock according to comparison signals from the comparison unit; a memory unit suitable for storing each counting information from the counting unit; a column readout circuit suitable for outputting data of the memory unit; and a control unit suitable for outputting the clock, and controlling operations of the row decoder, the ramp signal generation device, the counting unit, the memory unit and the column readout circuit.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1A:
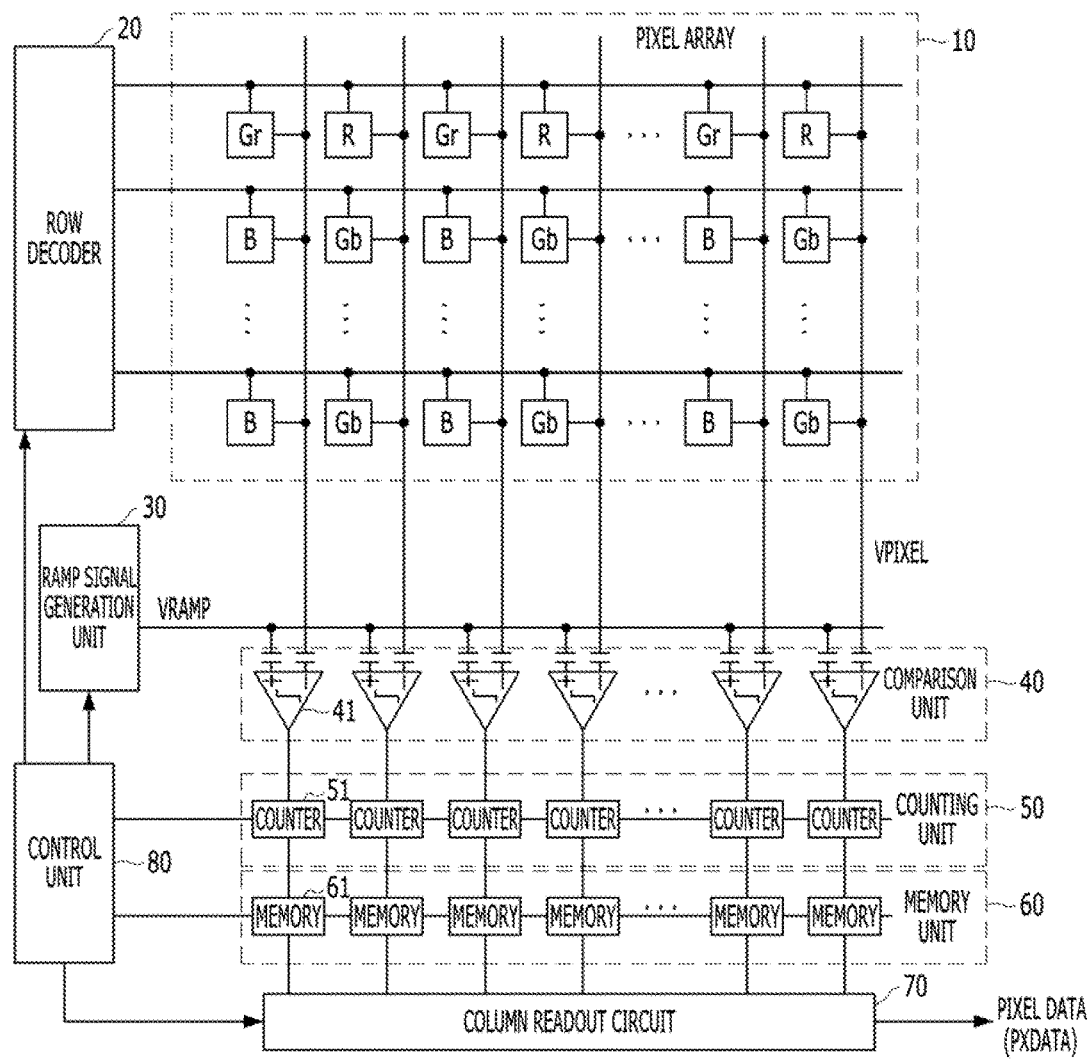
FIG. 1A is a diagram illustrating an exemplary conventional CMOS image sensor.

Various embodiments of the present invention will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

It will be understood that when an element is referred to as being "coupled" to another element, it may be directly coupled to the element or electrically coupled thereto with other elements interposed there between. Furthermore, when an element is referred to as "comprising" or "including" a component, it does not preclude another component but may further include other components unless the context clearly indicates otherwise. The terminology used herein is for the purpose of describing particular embodiments only and is not intended to be limiting. As used herein, the singular forms "a," "an" and "the" are intended to include the plural forms as well.

Figure 1B:
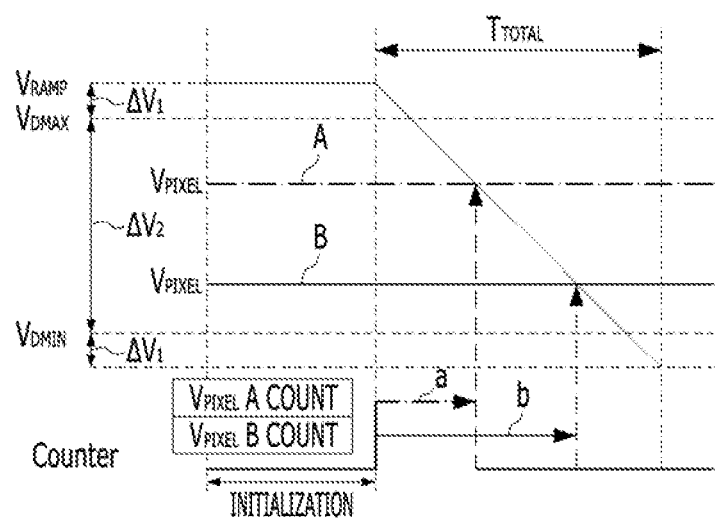
FIG. 1B is a timing diagram of conventional analog-to-digital conversion method of the CMOS image sensor shown in FIG. 1A.

FIG. 1A is a diagram illustrating a CMOS image sensor (CIS). FIG. 1A illustrates a CIS having a column parallel structure using a general single-slope analog-to-digital converter for the sake of the understanding of embodiments. FIG. 1B is a timing diagram explaining an analog-to-digital conversion method of the CIS shown in FIG. 1A.

As shown in FIG. 1A, the CIS includes a pixel array 10, a row decoder 20, a ramp signal generation unit 30, a comparison unit 40, a counting unit 50, a memory unit 60 a column readout circuit 70, and a control unit 80.

The pixel array 10 is configured to output an analog pixel signal $V_{PIXEL}$ corresponding to incident light. The row decoder 20 selects pixels in the pixel array 10 by respective row lines under control of the control unit 80, and controls the operations of the selected pixels. The ramp signal generation unit 30 generates a ramp signal $V_{RAMP}$ under control of the control unit 80. The comparison unit 40 compares a value of the ramp signal $V_{RAMP}$ applied from the ramp signal generation unit 30 with a value of each pixel signal outputted from each of the columns of the pixel array 10. The counting unit 50 counts clocks from the control unit 80 in response to comparison signals from the comparison unit 40. The memory unit 60 stores counting information from the counting unit 50 under control of the control unit 80. The column readout circuit 70 successively outputs data of the memory unit 60 as digital pixel data PXDATA under control of the control unit 80. The control unit 80 controls the operations of the row decoder 20, the ramp signal generation unit 30, the counting unit 50, the memory unit 60, and the column readout circuit 70.

In general, the CIS compares pixel signals (pixel output voltages) made before and after an optical signal is incident with each other in order to remove an undesired offset value existing intrinsically in a pixel, and measures only a pixel signal resulting from substantial incident light. This technique is called correlated double sampling (CDS). The CDS operation is performed by the comparison unit 40.

The comparison unit 40 includes a plurality of comparison devices, the counting unit 50 includes a plurality of counters, and the memory unit 60 includes a plurality of memories. In the illustrated image sensor of FIG. 1, one comparison device, one counter, and one memory are provided in series in each column corresponding to a column line of the pixel array.

Hereinafter, an operation of one comparison device, one counter, and one memory corresponding to a single column of the image sensor will be described by way of example.

A first comparison device 41 receives through one terminal thereof a pixel signal that is outputted from a first column of the pixel array 10, receives through the other terminal thereof a ramp signal $V_{RAMP}$ that is applied from the ramp signal generation device 30, compares values of the two signals with each other, and outputs a comparison signal through an output terminal.

In this regard, the voltage level of the ramp signal $V_{RAMP}$ is decreased gradually over time after initialization, and thus there is a time point at which the values of the two signals inputted to the first comparison device 41 coincide with each other. From the coincidence time point, the comparison signal outputted from the first comparison device 41 may be inverted.

A first counter 51 counts the clocks from the control unit 80 from a time point at which the voltage level of the ramp signal $V_{RAMP}$ begins to decrease, to a time point at which the, comparison signal outputted from the first comparison device 41 is inverted, and outputs counting information. Each counter is initialized in response to a reset signal from the control unit 80.

A first memory 61 stores the counting information received from the first counter 51 in response to a load signal received from the control unit 80, and outputs the counting information to the column readout circuit 70.

In the above-mentioned analog-to-digital conversion method, a total data conversion time $T_{TOTAL}$ to convert the analog pixel signal $V_{PIXEL}$ to the digital pixel data PXDATA is determined by a value of the data to be converted. The total data conversion time $T_{TOTAL}$ is expressed by the following [Equation 1] with reference to FIG. 1B.

$$T_{TOTAL}=(2*\Delta V_1+\Delta V_2)/\Delta V_{step} \qquad \text{[Equation 1]}$$

Here, $\Delta V_1 = V_{RAMP} - V_{DMAX}$, $\Delta V_2 = V_{DMAX} - V_{DMIN}$, and $\Delta V_{step}$ denotes a unit step when the ramp signal $V_{RAMP}$ decreases. $V_{DMAX}$ denotes the largest value within a range of a total amount of data to be converted in the analog-to-digital conversion. $V_{DMIN}$ denotes the smallest value within the range of the total amount of data to be converted in the analog-to-digital conversion.

For example, as shown in FIG. 1B, when the magnitude of a pixel signal $V_{PIXEL}$ is "A" a counting value, i.e., the number of counts counted by a corresponding counter of the counting unit 50, is "a". When the magnitude of the pixel signal $V_{PIXEL}$ is "V", a counting value is "b". As such, the counting value is determined depending on the magnitude of the pixel signal $V_{PIXEL}$.

However, in the analog-to-digital conversion method, it is difficult to minimize the data conversion time which is a time it takes to convert data. Hence, there is a disadvantage in that it is also difficult to reduce the number of counts.

Therefore, in an embodiment, an upper ramp signal or a lower ramp signal is selected depending on the magnitude of a pixel signal, which is checked by comparing the pixel signal with a reference voltage, and a comparison operation using the selected upper or lower ramp signal is performed. Therefore, the data conversion time is reduced so that data processing speed is increased, and power consumption is minimized. In addition, the number of counts is reduced so that power consumption required for counting and noise attributable to counting can be reduced.

Figure 2A:
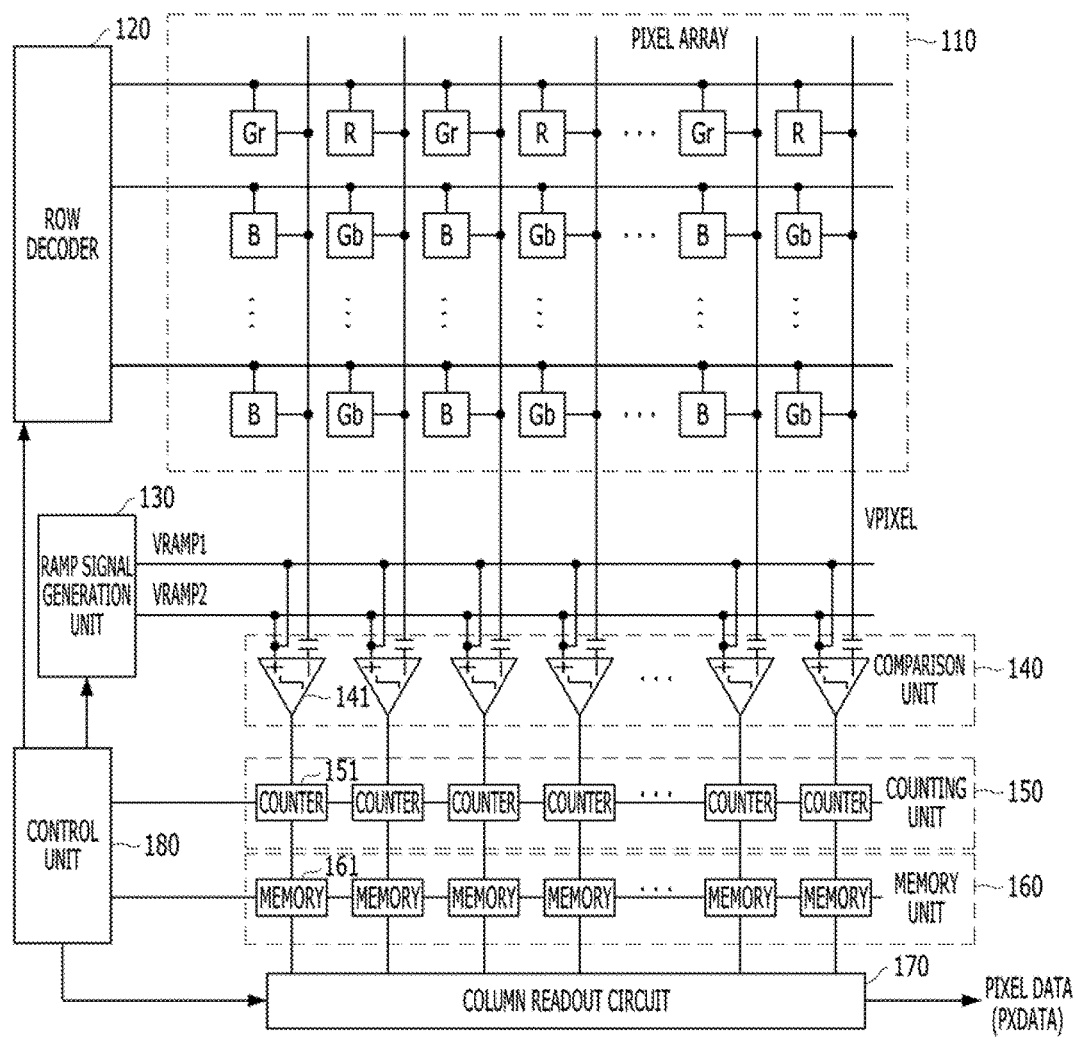
FIG. 2A is a diagram illustrating a CMOS image sensor in accordance with an embodiment of the present invention.
Figure 2B:
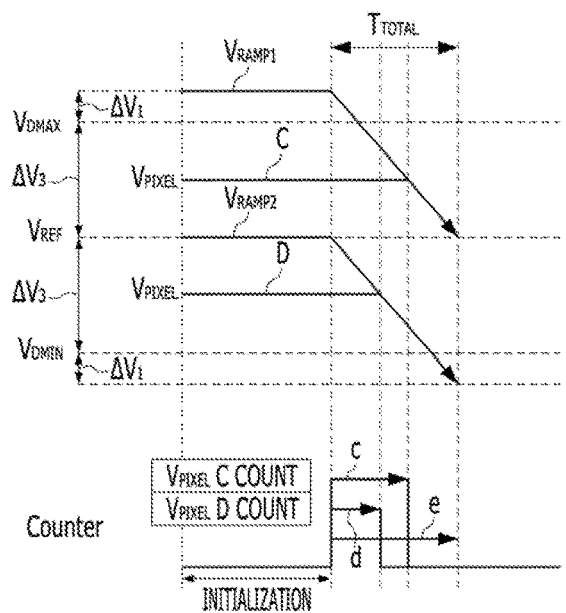
FIG. 2B is a timing diagram of an analog-to-digital conversion method of the CMOS image sensor shown in FIG. 2A, according to an embodiment of the present invention.

FIG. 2A is a diagram illustrating a CMOS image sensor in accordance with an embodiment of the present invention. FIG. 2B is a timing diagram showing an analog-to-digital conversion method of the CMOS image sensor shown in FIG. 2A.

As shown in FIG. 2A, the CIS in accordance with the embodiment includes a pixel array 110, a row decoder 120, a ramp signal generation unit 130, a comparison unit 140, a counting unit 150, a memory unit 160, a column readout circuit 170, and a control unit 180. The control unit 180 may include a timing generator.

The pixel array 110 is configured to output an analog pixel signal $V_{PIXEL}$ corresponding to incident light. The row decoder 120 may select pixels in the pixel array 110 by respective row lines under control of the control unit 180, and control the operations of the selected pixels. The ramp signal generation unit 130 may generate an upper ramp signal $V_{RAMP1}$ or a lower ramp signal $V_{RAMP2}$ under control of the control unit 180. The comparison unit 140 may select a value of the upper ramp signal $V_{RAMP1}$ or the lower ramp signal $V_{RAMP2}$ applied from the ramp signal generation unit 130 and compare the selected value with a value of each pixel signal outputted from columns of the pixel array 110. The counting unit 150 may count clocks from the control unit 180 according to comparison signals from the comparison unit 140. The memory unit 160 may store counting information from the counting unit 150 under control of the control unit 180. The column readout circuit 170 may successively output data of the memory unit 160 as digital pixel data PXDATA under control of the control unit 180, and the control unit 180 may control the operations of the row decoder 120, the ramp signal generation unit 130, the counting unit 150, the memory unit 160, and the column readout circuit 170.

The comparison unit 140 may include a plurality of comparison devices, the counting unit 150 may include a plurality of counters, and the memory unit 160 may include a plurality of memories. In an embodiment, the comparison devices, the counters, and the memories are provided for respective columns.

Hereinafter, an operation of one comparison device, one counter, and one memory corresponding to one column will be described by way of example.

A first comparison device 141 may receive a pixel signal outputted from a first column of the pixel array 110 through a first input terminal, select any one of an upper ramp signal $V_{RAMP1}$ and a lower ramp signal $V_{RAMP2}$, which are applied from the ramp signal generation unit 130, receives the selected signal through a second input terminal, compare values of the two signals with each other, and output a comparison signal through an output terminal.

Here, as shown in FIG. 2B, the upper ramp signal $V_{RAMP1}$ has a first constant voltage level during initialization. The first constant voltage level is set to a value greater than $V_{DMAX}$ by a preset value (i.e., $V_{DMAX}+\Delta V_1$). The lower ramp signal $V_{RAMP2}$ has a second constant voltage level lower than the first constant voltage level during the initialization. The second constant voltage level of the lower ramp signal $V_{RAMP2}$ is set to $(V_{DMAX}+V_{DMIN})/2$ as a reference voltage $V_{REF}$. The upper ramp signal $V_{RAMP1}$ is a signal, the voltage level of which starts to decrease towards the reference voltage $V_{REF}$ when a predetermined time has passed after the initialization. The lower ramp signal $V_{RAMP2}$ is a signal, the voltage level of which starts to decrease from the reference voltage $V_{REF}$ to a value smaller than $V_{DMIN}$ by the preset value (i.e., $V_{DMIN}-\Delta V_1$) when the predetermined time has passed after the initialization. Eventually, there is a time point at which the value of the selected one of the upper ramp signal $V_{RAMP1}$ and the lower ramp signal $V_{RAMP2}$ that is inputted to each comparison device coincides with the value of the pixel signal. From the coincidence time point, the comparison signal outputted from the first comparison device 141 may be inverted.

The first counter 151 may count clocks from the control unit 180 from a time point at which the voltage level of the selected ramp signal begins to decrease, to a time point at which the comparison signal outputted from the first comparison device 141 is inverted, and may output counting information. Each counter may be initialized in response to a reset signal from the control unit 180.

A first memory 161 may store the counting information from the first counter 151 in response to a load signal from the control unit 180, and output the counting information to the column readout circuit 170.

In the above-described analog-to-digital conversion method in accordance with the embodiment, a data conversion time $T_{TOTAL}$ to convert the analog pixel signal $V_{PIXEL}$ to the digital pixel data PXDATA may be determined by the following [Equation 2].

$$T_{TOTAL}=(\Delta V_1+\Delta V_3)/\Delta V_{step} \qquad \text{[Equation 2]}$$

Here, $\Delta V_1=V_{RAMP1}-V_{DMAX}$, $\Delta V_3=(V_{DMAX}-V_{DMIN})/2$, and $\Delta V_{step}$ denotes a unit step when the selected ramp signal decreases. $V_{DMAX}$ denotes the largest value within a range of a total amount of data to be converted in the analog-to-digital conversion. $V_{DMIN}$ denotes the smallest value within the range of the total amount of data to be converted in the analog-to-digital conversion.

In the above-described analog-to-digital conversion method in accordance with the embodiment, the maximum time it takes to convert the analog pixel signal $V_{PIXEL}$ to the digital pixel data PXDATA is reduced by more than half of that of the conventional analog-to-digital conversion method of FIG. 1B.

For example, as shown in FIG. 2B, when the magnitude of a pixel signal $V_{PIXEL}$ is "C", counting value, i.e., the number of counts counted by a corresponding counter of the counting unit 150, is "c". When the magnitude of the pixel signal $V_{PIXEL}$ is "D", a counting value is "d". Here, a substantial counting value for the pixel signal $V_{PIXEL}$ "D" should be compensated for a value obtained by adding a count value "e" for the total data conversion time to the counting value "d". Therefore, the counting unit or a following processor (e.g., an image signal process (ISP)) may perform an operation of compensating for the counting value "d". The count value "e" for the total data conversion time is a preset value which is already known.

Figure 3A:
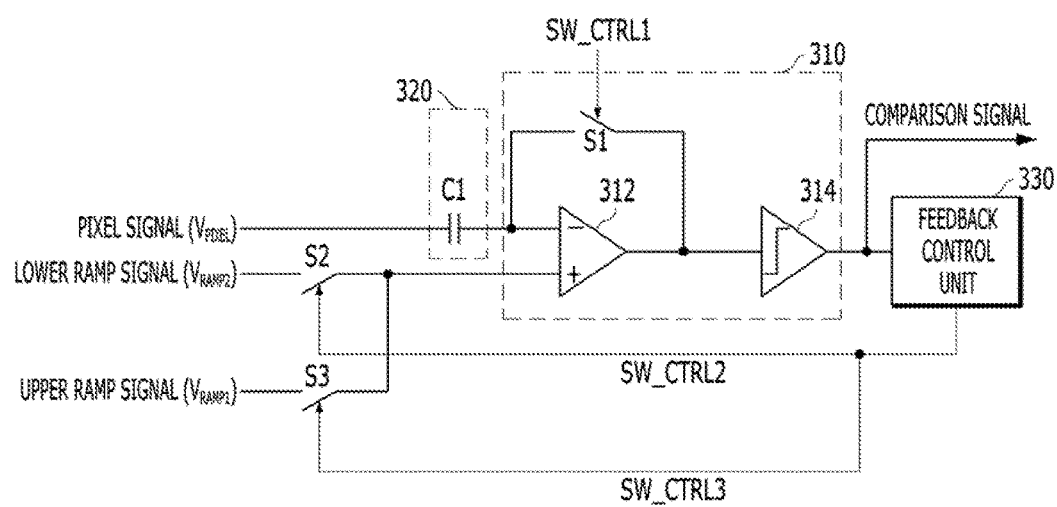
FIG. 3A is a diagram illustrating a comparison device in accordance with an embodiment of the present invention.
Figure 3B:
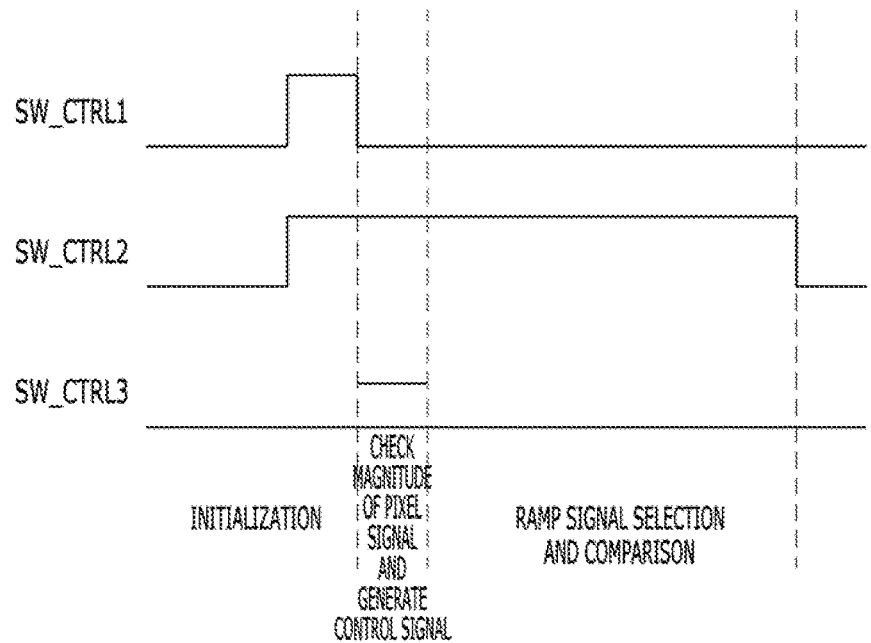
FIGS. 3B and 3C are timing diagrams of an operation of the comparison device shown in FIG. 3A according to an embodiment of the present invention.
Figure 3C:
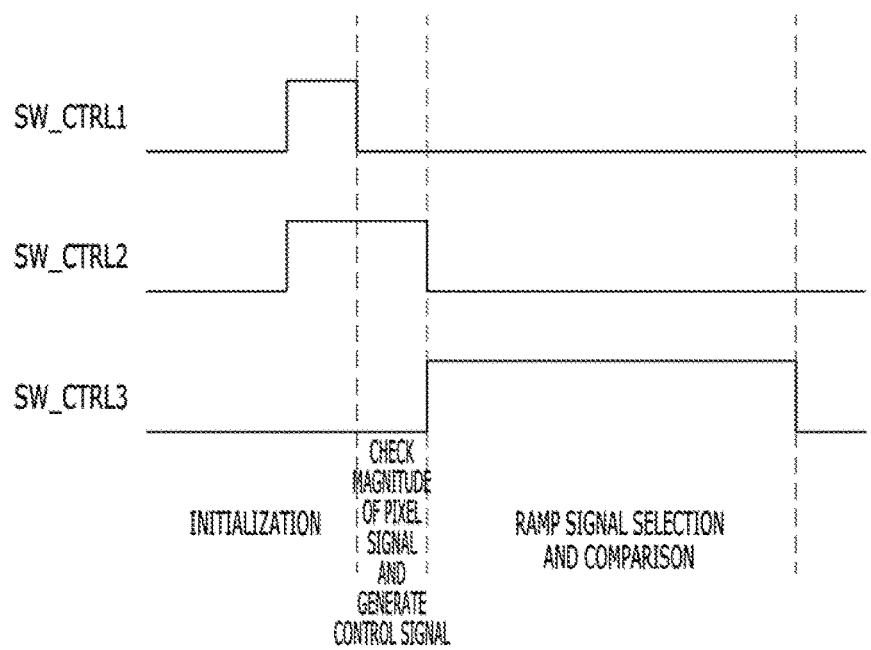
Figure 3D:
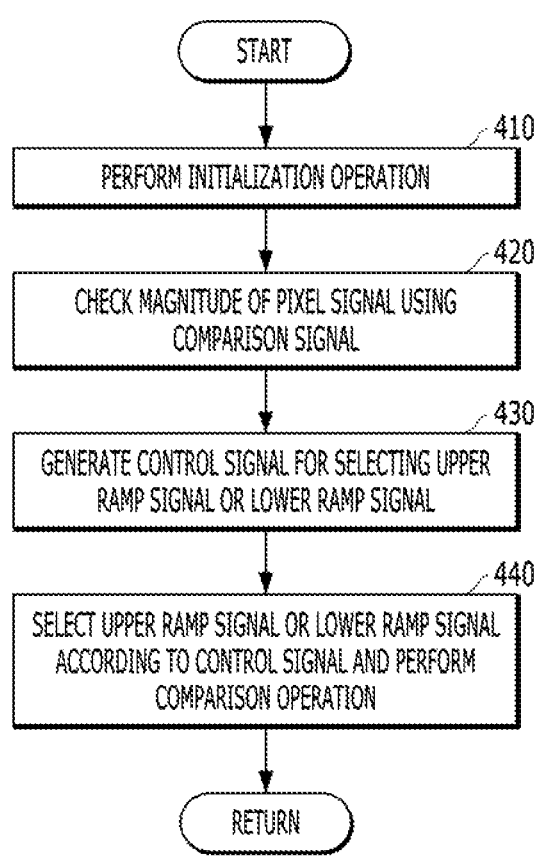
FIG. 3D is a flowchart showing an operating method of the comparison device shown in FIG. 3A according to an embodiment of the present invention.

FIG. 3A is a diagram illustrating a comparison device in accordance with an embodiment of the present invention. FIGS. 3B and 3C are timing diagrams showing an operation of the comparison device shown in FIG. 3A in accordance with an embodiment of the present invention. FIG. 3D is a flowchart showing an operating method of the comparison device shown in FIG. 3A in accordance with an embodiment of the present invention. FIG. 3B illustrates a timing diagram when a pixel signal $V_{PIXEL}$ is equal to or less than a reference voltage $V_{REF}$ i.e., $(V_{DMAX}+V_{DMIN})/2$. FIG. 3C is a timing diagram when the pixel signal $V_{PIXEL}$ is greater than the reference voltage $V_{REF}$. The comparison device of FIG. 3A may correspond to any comparison device included in the comparison unit 140 of FIG. 2A.

As shown in FIG. 3A, the comparison device in accordance with the embodiment includes a comparison block 310, a CDS block 320, a second switch S2, a third switch S3, and a feedback control unit 330.

The comparison block 310 may compare a ramp signal selected from an upper ramp signal $V_{RAMP1}$ and a lower ramp signal $V_{RAMP2}$ with the pixel signal $V_{PIXEL}$. The CDS block 320 may be provided between a first input terminal to which the pixel signal $V_{PIXEL}$ is inputted and a negative input terminal (−) of the comparison block 310 and configured to perform CDS. The second switch S2 may be provided between a second input terminal to which the lower ramp signal $V_{RAMP2}$ is inputted and a positive input terminal (+) of the comparison block 310. The third switch S3 may be provided between a third input terminal to which the upper ramp signal $V_{RAMP1}$ is inputted and the positive input terminal (+) of the comparison block 310. The feedback control unit 330 may check the magnitude of the pixel signal $V_{PIXEL}$ in response to a comparison signal from the comparison block 310, and output a second switch control signal SW_CTRL2 or a third switch control signal SW_CTRL3 for controlling the second or third switch S2 or S3.

The comparison block 310 may check the magnitude of the pixel signal $V_{PIXEL}$ by comparing the pixel signal $V_{PIXEL}$ with the reference voltage $V_{REF}$ after initialization, generate the second and third control signals SW_CTRL2 and SW_CTRL3 for selecting one of the upper ramp signal $V_{RAMP1}$ and the lower ramp signal $V_{RAMP2}$ according to a result of the checking, and select the upper ramp signal $V_{RAMP1}$ or the lower ramp signal $V_{RAMP2}$ in response to the second and third control signals SW_CTRL2 and SW_CTRL3 and then perform a comparison operation using the selected ramp signal. In an embodiment, the magnitude of the pixel signal $V_{PIXEL}$ is checked by comparing the pixel signal $V_{PIXEL}$ with the reference voltage $V_{REF}$. When the pixel signal $V_{PIXEL}$ is greater than the reference voltage $V_{REF}$, the third control signal SW_CTRL3 for selecting the upper ramp signal $V_{RAMP1}$ is generated so that a comparison operation is performed using the upper ramp signal $V_{RAMP1}$. When the pixel signal $V_{PIXEL}$ is equal to or less than the reference voltage, the second control signal SW_CTRL2 for selecting the lower ramp signal $V_{RAMP2}$ is generated so that a comparison operation is performed using the lower ramp signal $V_{RAMP2}$.

For example, the comparison block 310 may be embodied using a comparator 312, a first switch S1 and an amplifier 314. The first switch S1 may be turned on in response to a first control signal SW_CTRL1 provided from the control unit 180. In another embodiment, the comparison block 310 may be embodied using a comparator and a switch without an amplifier. The CDS block 320 may be embodied using a capacitor C1. In another embodiment, the CDS block 320 may be embodied using a first capacitor, a second capacitor and a switch. These are well-known techniques, and thus further explanation thereof is deemed unnecessary.

Hereinafter, an operation process of the comparison device will be descried with reference to FIGS. 3A to 3D.

The overall operation of the comparison device is implemented in a sequence of an initialization operation, a pixel signal magnitude checking operation, a control signal generation operation, and a ramp signal selection and comparison operation.

The comparison device performs the initialization operation at step 410. During the initialization operation, since first and second control signals SW_CTRL1 and SW_CTRL2 are activated to a high level, and a third control signal SW_CTRL3 is deactivated to a low level, the first and second switches S1 and S2 are turned on, and the third switch S3 is turned off. A lower ramp signal is inputted to the positive input terminal (+) of the comparison block 310 through the second input terminal, and the negative input terminal (−) of the comparison block 10 is coupled to the output terminal of the comparison block 310. Accordingly, the comparison device is initialized so that reset noises of the pixel signal inputted from the first input terminal and offset of the comparison device may be removed.

Subsequently, the comparison device checks the magnitude of the pixel signal using the comparison signal at step 420, and generates the second control signal SW_CTRL2 or the third control signal SW_CTRL3 for selecting the upper ramp signal or the lower ramp signal depending on a result of the checking at step 430. That is, when the pixel signal is greater than the reference voltage, the comparison device generates the third control signal SW_CTRL3 for selecting the upper ramp signal, and when the pixel signal is equal to or less than the reference voltage, the comparison device generates the second control signal SW_CTRL2 for selecting the lower ramp signal. In more detail, since the first control signal SW_CTRL1 and the third control signal SW_CTRL3 are deactivated to a low level, and the second control signal SW_CTRL2 is activated to a high level, the first switch S1 and the third switch S3 are turned off and the second switch S2 is turned on during the pixel signal magnitude checking operation. Accordingly, the comparison device starts to compare the pixel signal with the lower ramp signal, i.e., the reference voltage to output a comparison signal. As the result of the checking of the magnitude of the pixel signal using the comparison signal, when the pixel signal is greater than the reference voltage, the feedback control unit 330 generates the third control signal SW_CTRL3 for selecting the upper ramp signal, and when the pixel signal is equal to or less than the reference voltage, the feedback control unit 330 generates the second control signal SW_CTRL2 for selecting the lower ramp signal. In this case, the counter and the memory acquire and store data of a most significant bit (MSB).

Thereafter, the comparison device selects the upper ramp signal or the lower ramp signal in response to the third control signal SW_CTRL3 or the second control signal SW_CTRL2 and performs a comparison operation at step 440. For example, the comparison device selects the rising ramp signal in response to the third control signal SW_CTRL3 for selecting the upper ramp signal and performs the comparison operation, or selects the lower ramp signal in response to the second control signal SW_CTRL2 for selecting the lower ramp signal and performs the comparison operation.

In more detail, referring to FIG. 3B, the first control signal SW_CTRL1 and the third control signal SW_CTRL3 are deactivated to a low level, and the second control signal SW_CTRL2 is activated to a high level. Since the first switch S1 and the third switch S3 are turned off and the second switch S2 is turned on, the lower ramp signal is inputted to the positive input terminal (+) of the comparison block 310 through the second input terminal. Accordingly, the comparison block 310 compares the pixel signal with the lower ramp signal and outputs the comparison signal to the feedback control unit 330.

Referring to FIG. 3C, the first control signal SW_CTRL1 and the second control signal SW_CTRL2 are deactivated to a low level, and the third control signal SW_CTRL3 is activated to a high level. Since the first switch S1 and the second switch S2 are turned off and the third switch S3 is turned on, the upper ramp signal is inputted to the positive input terminal (+) of the comparison block 310 through the third input terminal. Accordingly, the comparison block 310 compares the pixel signal with the upper ramp signal and outputs the comparison signal to the feedback control unit 330. Here, the counter and the memory perform a counting operation and a data conversion operation to store data.

With regard to another embodiment different from the comparison device in accordance with the above-described embodiment, the comparison device may be embodied with a capacitor which is further provided between the third switch S3 and the positive input terminal (+) of the comparison block 310.

In accordance with various embodiments of the present invention, a time it takes to convert an analog pixel signal into a digital pixel data may be reduced so that data processing speed may be enhanced. The magnitude of the pixel signal may be checked by comparing the pixel signal with a reference voltage, an upper ramp signal or a lower ramp signal may be selected depending on a result of the checking, and then data conversion may be performed. Hence, a data conversion time it takes to convert the pixel signal into the pixel data may be reduced to at least ½ of that of a conventional art.

In accordance with various embodiments, the data conversion time is reduced, and thus power consumption may be minimized.

In accordance with various embodiments, the number of counts required for data conversion is reduced, and thus power consumption required for counting and noise attributable to counting can be reduced.

Although various embodiments have been described for illustrative purposes, it will be apparent to those skilled in the art that various changes and modifications may be made without departing from the spirit and scope of the disclosure as defined in the following claims.

What is claimed is:

1. A comparison device comprising:
   a comparison block suitable for comparing an upper ramp signal or a lower ramp signal with a pixel signal, and outputting a comparison signal;
   a correlated double sampling (CDS) block provided between a first input terminal into which the pixel signal is inputted and a negative input terminal of the comparison block, and configured to perform correlated double sampling;
   a second switch provided between a second input terminal into which the lower ramp signal is inputted and a positive input terminal of the comparison block;
   a third switch provided between a third input terminal into which the upper ramp signal is inputted and the positive input terminal of the comparison block; and
   a feedback control unit suitable for checking a magnitude of the pixel signal according the comparison signal and outputting a second control signal or a third control signal for controlling the second or third switch.

2. The comparison device of claim 1, wherein the comparison device selects the upper ramp signal or the lower ramp signal depending on the magnitude of the pixel signal checked by comparing the pixel signal with a reference voltage, and performs a comparison operation.

3. The comparison device of claim 2, wherein the comparison device selects the upper ramp signal in response to the third control signal, and performs the comparison operation using the upper ramp signal, when the pixel signal is greater than a reference voltage, and
   the comparison device selects the lower ramp signal in response to the second control signal, and performs the comparison operation using the lower ramp signal, when the pixel signal is equal to or less than the reference voltage.

4. The comparison device of claim 2, wherein the upper ramp signal has a first constant voltage level during initialization, and decreases to the reference voltage as a predetermined time has passed after the initialization, and
   the lower ramp signal has a second constant voltage level lower than the first constant voltage level during the initialization, and decreases from the second constant voltage level as the predetermined time has passed after the initialization.

5. The comparison device of claim 4, wherein the reference voltage has the second constant voltage level.

6. The comparison device of claim 1, further comprising a capacitor provided between the third switch and the positive input terminal of the comparison block.

7. The comparison device of claim 1, wherein the comparison block includes:
   a comparator including the negative input terminal and the positive input terminal, and an output terminal; and
   a first switch coupled between the negative input terminal and the output terminal.

8. The comparison device of claim 1, wherein the CDS block includes a first capacitor.

* * * * *